United States Patent [19]

Matsumoto

[11] Patent Number: 5,179,537
[45] Date of Patent: Jan. 12, 1993

[54] SEMICONDUCTOR MEMORY DEVICE HAVING MONITORING FUNCTION

[75] Inventor: Osamu Matsumoto, Kawasaki, Japan

[73] Assignee: Kabushiki Kaisha Toshiba, Kawasaki, Japan

[21] Appl. No.: 642,526

[22] Filed: Jan. 17, 1991

[30] Foreign Application Priority Data

Jan. 19, 1990 [JP] Japan .................................. 2-9574

[51] Int. Cl.$^5$ .............................................. G11C 7/00
[52] U.S. Cl. .................................. 365/201; 365/185; 365/189.09; 371/21.1
[58] Field of Search .................. 365/189.01, 185, 226, 365/227, 201, 174, 189.09; 307/304, 450; 371/21.1, 21.4

[56] References Cited

U.S. PATENT DOCUMENTS

| | | | |
|---|---|---|---|
| 3,801,802 | 4/1974 | Barwig et al. | 365/201 X |
| 4,253,059 | 2/1981 | Bell et al. | 371/21.4 |
| 4,393,475 | 7/1983 | Kitagawa et al. | 365/201 |
| 4,651,304 | 3/1987 | Takata | 365/201 |
| 4,779,272 | 10/1988 | Kohda et al. | 371/21.4 |
| 4,819,212 | 4/1989 | Nakai et al. | 365/185 X |
| 4,943,948 | 7/1990 | Morton et al. | 365/201 |
| 4,949,307 | 8/1990 | Campardo | 365/201 |
| 4,956,819 | 9/1990 | Hoffmann et al. | 371/21.1 X |
| 4,982,364 | 1/1991 | Iwahashi | 365/185 X |

FOREIGN PATENT DOCUMENTS

| | | |
|---|---|---|
| 0244628A1 | 11/1987 | European Pat. Off. . |
| 0443776 | 8/1991 | European Pat. Off. ....... 365/189.01 |
| 3215671A1 | 11/1983 | Fed. Rep. of Germany . |
| 0078500 | 3/1989 | Japan .................................. 371/21.1 |
| 2070372A | 9/1981 | United Kingdom . |

OTHER PUBLICATIONS

Atsumi et al., "Fast Programmable 256K Read Only Memory with On-Chip Test Circuits", IEEE Journal of Solid State Circuits, vol. 20, No. 1, Feb. 1985, pp. 422-427.

R. Gastaldi et al. "A 1-Mbit CMOS EPROM with Enhanced Verification", IEE Journal of Solid-State Circuits, vol. 23, No. 5, Oct. 1988.

Primary Examiner—Eugene R. LaRoche
Assistant Examiner—Son Dinh
Attorney, Agent, or Firm—Finnegan, Henderson, Farabow, Garrett and Dunner

[57] ABSTRACT

Memory cells providing a memory cell array are each fromed of a floating gate MOS transistor for storing data and a select MOS transistor and the memory cell is connected to a power source via a MOS transistor providing a load element. A potential on the connection node A between the load element and the memory cell is detected by an inverter providing a potential detection circuit and a monitor output is derived from the inverter. A load providing MOS transistor having a source connected to the source of the MOS transistor providing the load element and a gate connected to the gate of the MOS transistor providing the load element is provided, a pad to which a control voltage is supplied is connected to the drain of the MOS transistor and the control voltage from the pad is applied to the gates of the MOS transistors to provide a current mirror circuit.

12 Claims, 5 Drawing Sheets

SEMICONDUCTOR MEMORY DEVICE HAVING MONITORING FUNCTION

BACKGROUND OF THE INVENTION

1. Field of the Invention

This invention relates to a semiconductor memory device such as an EEPROM or EPROM which is constructed by a semiconductor integrated circuit, and more particularly to a semiconductor memory device having monitoring function for measuring the threshold levels of a large number of memory cells includes a memory cell array.

2. Description of the Related Art

In a nonvolatile semiconductor memory which is formed in an LSI configuration like an EEPROM constructed by an array of electrically erasable and programmable read only memory cells or an EPROM constructed by an array of ultra violet erasable and programmable read only memory cells, a monitoring circuit for externally determining the states of the memory cells, for example, the threshold levels of the memory cells, is provided.

Figure 9:
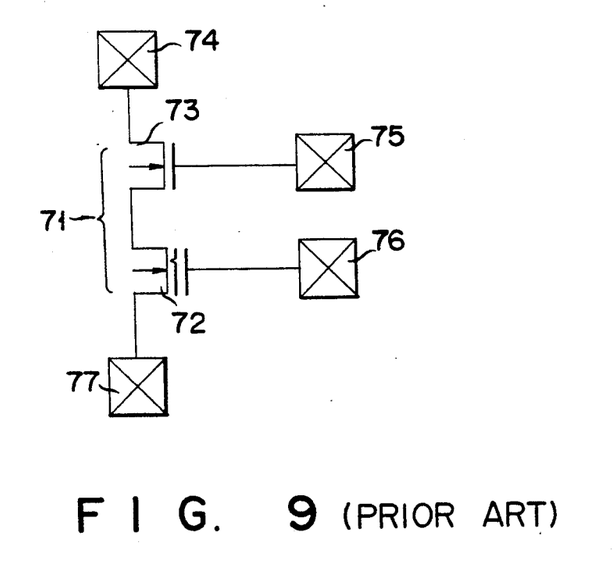
FIG. 9 is a circuit diagram showing a monitoring circuit contained in the conventional memory device.

FIG. 9 shows an example of a monitoring circuit contained in the conventional EEPROM, and the monitoring circuit is formed in the integrated circuit chip in position different from the memory cell array. The monitoring circuit includes an EEPROM cell 71 having the same construction as the memory cell constituting the memory cell array formed in the semiconductor chip. The EEPROM cell 71 is provided by a series circuit of a floating gate MOS transistor 72 for a memory cell and a cell selects MOS transistor 73. The drain and gate electrodes of the MOS transistor 72 and the gate and source electrodes of the MOS transistor 73 are connected to monitoring pads 74, 75, 76 and 77 provided on the semiconductor chip.

When the monitoring circuit of the above construction is used to monitor the EEPROM, detecting needles or the like are in contact with the respective pads 74 to 77 from the exterior of the chip to determine the operating condition of the monitoring EEPROM cell 71. However, the EEPROM having the monitoring circuit contained therein has the following defects.

First, since it is necessary to set the detecting needles in contact with the pads 74 to 77 provided on the integrated circuit chip when monitoring the EEPROM, the monitoring operation cannot be effected after the integrated circuit chip is molded with resin and the EEPROM cannot be evaluated after it is provided as a finished product.

Secondly, since it is necessary to form a plurality of pads each of which requires a relatively large occupied area on the semiconductor chip, the finite chip area cannot be effectively used.

Thirdly, the monitoring circuit is formed in position different from the memory cell array and it monitors a memory cell different from a memory cell which is actually operated. That is, the memory cells include the memory cell array cannot be directly monitored and each of the memory cells cannot be checked and evaluated at the LSI level on the entire memory cell array.

SUMMARY OF THE INVENTION

An object of this invention is to provide a semiconductor memory device having a monitoring function in which a memory cell array can be checked and evaluated even after the semiconductor chip is molded with resin to form a finished product.

Another object of this invention is to provide a semiconductor memory device in which all of the memory cells constituting a memory cell array provided on the semiconductor chip can be directly checked and evaluated.

Still another object of this invention is to provide a semiconductor memory device which is constituted by a highly reliable semiconductor integrated circuit and in which each memory cell can be checked and evaluated at the LSI level on the entire memory cell array.

A semiconductor memory device having a monitoring function according to this invention has a load element in which a current controlled according to a control voltage supplied from a pad formed on a semiconductor chip flows and a current is caused to flow in respective memory cells constituting a memory cell array via the load element. A potential on the connection node between the load element and each of the memory cells is detected by means of a potential detection circuit and is derived to the exterior as a monitor output.

With the semiconductor memory the device of the above construction, the memory cells constituting the memory cell array are sequentially selected by a selection signal and a current is supplied to the selected memory cell from the load element. In this case, the current supplying ability for the memory cell is determined by the input control voltage for controlling the load element and each of the memory cells is checked and evaluated according to the relation between the control voltage and the monitor output. In the semiconductor memory device, the load element and the pad for inputting a control voltage for controlling the load element are formed in addition to the memory cell array to be evaluated so as to provide a monitoring function, and therefore it is not necessary to form a specified monitoring area on the semiconductor chip. One of the pads formed on the memory device can be used as the pad to which a control voltage is input and a sense amplifier to which an output from the memory cell array is supplied can be used as the potential detection circuit for deriving a monitor output. Therefore, the area of the semiconductor chip can be effectively used and all of the memory cells constituting the memory cell array can be evaluated. Further, the memory cell array can be easily monitored even after the semiconductor chip is molded to form a finished product by using one of the pads formed for effecting specified functions also as the pad for inputting a control voltage.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferreq embodiments given below, serve to explain the principles of the invention.

DETAILED DESCRIPTION OF THE PREFERRED EMBODIMENTS

Figure 1:
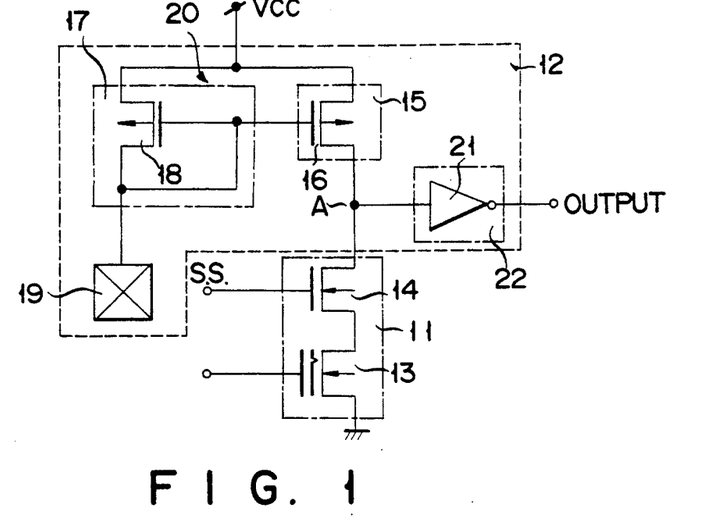
FIG. 1 is a circuit diagram showing a monitoring circuit section corresponding to one memory cell of a semiconductor memory device according to a first embodiment of this invention.

FIG. 1 shows a portion corresponding to a N-channel type monitoring cell 11 constituted by one EEPROM cell of a memory cell array constituting an EEPROM together with a monitoring circuit 12. The monitoring cell 11 is constituted by connecting the drain of a floating gate MOS transistor 13 for a memory cell to the source of a memory cell select MOS transistor 14 and the source of the floating gate MOS transistor 13 is grounded. The monitoring cell 11 is supplied with a current from a load element 15 of the monitoring circuit 12, and the load element 15 is constituted by a P-channel MOS transistor 16. The drain of the MOS transistor 16 is connected to the drain of the select MOS transistor 14 and the source of the MOS transistor 16 is connected to a DC power source Vcc.

The load element 15 is controlled by a load controlling circuit 17 and controls the current supplying ability for the monitoring cell 11. The load controlling circuit 17 is constituted by a P-channel MOS transistor 18 having the same dimensions (channel width W/channel length L) as the MOS transistor 16. The sources of the MOS transistors 16 and 18 are connected together and connected to the power source Vcc. The drain of the MOS transistor 18 is connected to a pad 19 to which a control voltage is supplied and the pad 19 is connected to the gate of the MOS transistor 18. The gates of the MOS transistors 16 and 18 are connected together so that a current mirror circuit 20 can be provided by the MOS transistors 16 and 18.

The connection node A between the drain of the MOS transistor 16 and the drain of the MOS transistor 14 for selecting the monitoring cell 11 is connected to a potential detection circuit 22 constituted by an inverter 21. A signal of high or low level detected by the potential detection circuit 22 is supplied to the exterior as an output signal of the monitoring circuit 12.

In a case where the semiconductor memory device is monitored, a control voltage is input to the pad 19 provided on the semiconductor chip by use of a suitable contact. The control voltage is applied to the gates of the MOS transistors 16 and 18 of the current mirror circuit 20 and the resistance between the drain and source resistance between the drain and source of the MOS transistor 13 constituting the memory cell is set according to the threshold level which is determined according to the data programming level.

Assume that a state in which is set, that is, a selection signal (SS) is supplied to the gate of the selection MOS transistor 14 and the MOS transistor 14 is set in the ON state. If, in this state, the resistance of the monitoring cell 11 is smaller than that (load resistance) of the load element 15 set when the MOS transistor 16 is turned on, the potential on the connection node A between the load element 15 and the monitoring cell 11 is set to a low level "L". As a result, an output of the inverter 21 becomes high level "H". In contrast, if the resistance of the monitoring cell 11 is larger than that of the load element 15, an output of the inverter 21 is set to the low level "L".

The MOS transistor 16 is controlled by a control voltage applied to the pad 19, and the resistance of the MOS transistor 16 set in the ON state is determined according to the value of the control voltage applied to the pad 19. Therefore, if the resistance of the monitoring cell 11 is kept constant and the resistance of the MOS transistor 16 is controlled by the control according to the input control voltage and the level of an output of the inverter 21 is changed from "H" to "L" or from "L" to "H". Thus, the state of the monitoring cell 11 can be checked by monitoring the input control voltage when the output of the inverter is changed.

In this circuit, the transistor 16 and the load controlling MOS transistor 18 constitute the current mirror circuit 20 having the mirror ratio of 1 : 1. Therefore, the input control voltage and a current flowing in the MOS transistor 16 are respectively set equal to the terminal voltage of the monitoring cell 11 and a current flowing in the monitoring cell 11. As a result, the level of data written into the MOS transistor 13 can be indirectly measured based on the control voltage applied to the pad 19 and on the control current flowing from the power source Vcc to the pad 19 via the MOS transistor 18.

In the semiconductor memory device having the monitoring function, the pad 19 for supplying the control voltage can also be used as another pad used in the readout control operation of the memory device, for example. Further, the inverter 21 can also be used as a this way, by using the elements constituting the monitoring circuit 12 also as the constituents of the memory device, a monitoring control voltage can be input via an external terminal (pin) which is used in the operation mode of the memory device even after the semiconductor chip constituting the memory device is molded to form a finished product. Further, a monitoring output can be derived from a data output pin to which a data readout sense amplifier is connected and which is used in an ordinary operation mode, thereby making it possible to check and evaluate the monitoring cell 11. In this case, it is not necessary to provide a pad which requires a relatively large occupied area on the semiconductor chip only for attaining the monitoring function and thus the area of the integrated circuit semiconductor chip can be fully effectively used.

Figure 2:
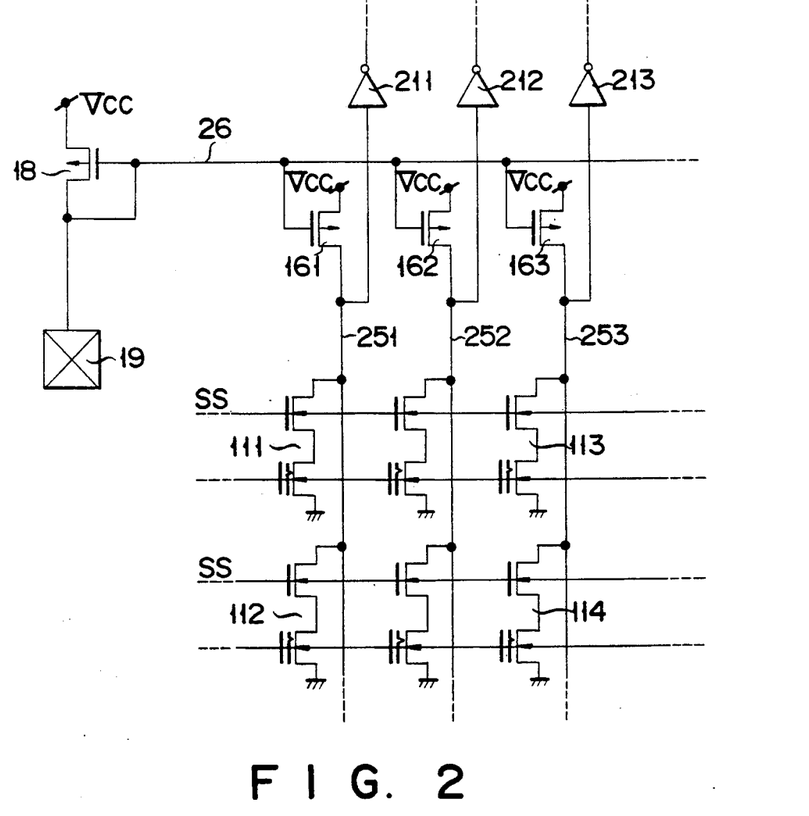
FIG. 2 is a circuit diagram showing the state in which the monitoring circuit shown in FIG. 1 is provided in a memory cell array section.

FIG. 2 shows a state in which the monitoring circuit thus constructed is incorporated into an actual memory device and a plurality of bit lines 251, 252, —constituting the memory cell array are respectively connected to memory cells 111, 112, —used as the monitoring cells. MOS transistors 161, 162, —constituting the load element are respectively connected to the bit lines 251, 252, —, and the power source Vcc is connected to the bit lines 251, 252, —via the respective MOS transistors 161, 162, —. The respective gates of the MOS transistors 161, 162, —are connected to a common line 26 which is also connected to the gate of the load controlling MOS transistor 18 and to the pad 19 for inputting the control voltage. The bit lines 251, 252, —are respectively connected to inverters 211, 212, —constituting the sense amplifiers used for reading out memory data so as to derive outputs corresponding to the voltage levels of the bit lines 251, 252, —to the exterior.

In the above memory device, current mirror circuits are provided for the respective bit lines 251, 252, —by the MOS transistors 161, 162, —connected to the bit lines 251, 252, —and the MOS transistor 18. Therefore, one of the memory cells can be selected by supplying a selection signal to the select MOS transistor for each of the memory cells 111, 112, —and the data storing state of the thus selected memory cell can be independently checked and evaluated.

Figure 3:
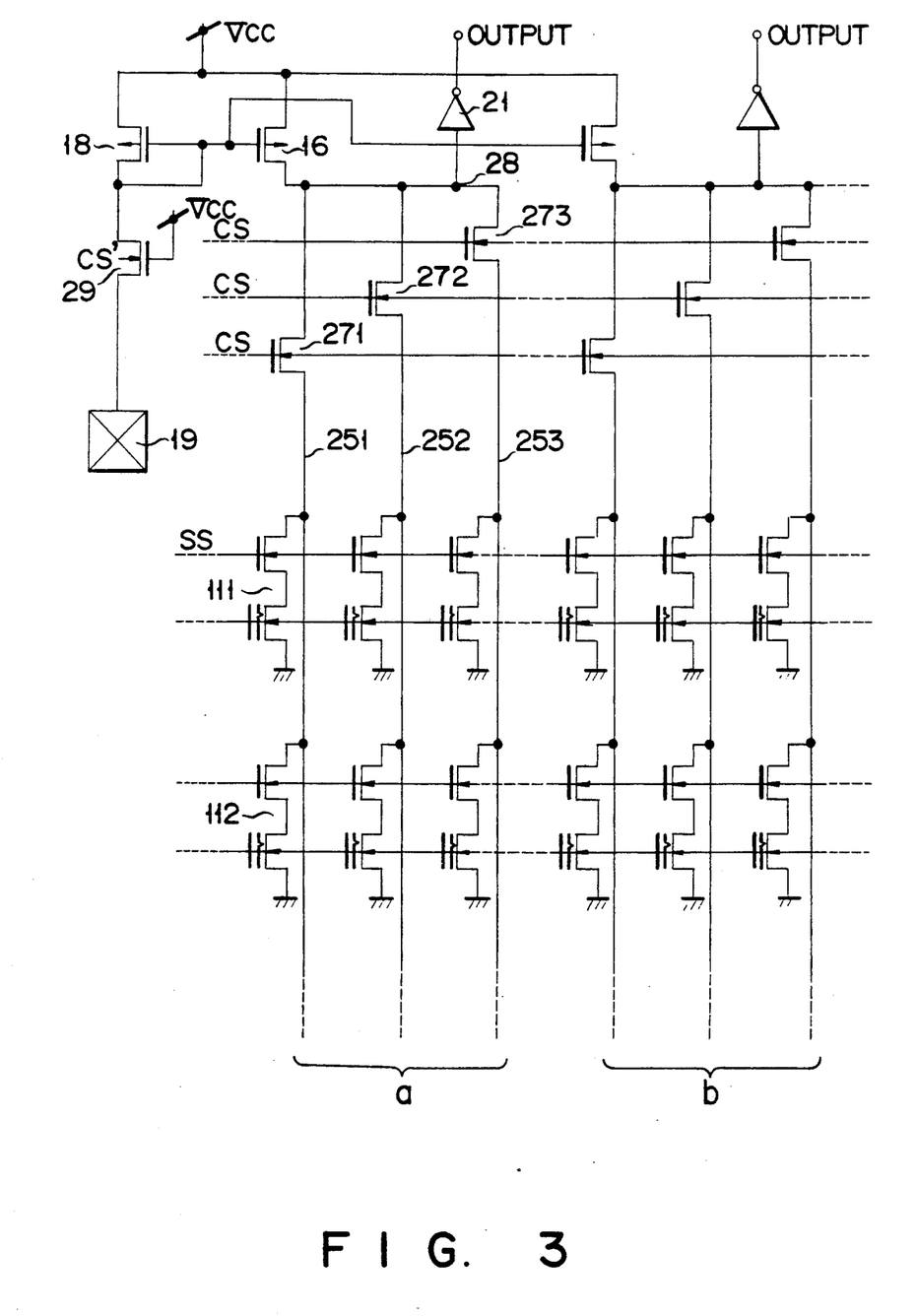
FIG. 3 is a circuit diagram showing a second embodiment of a memory cell array section.

FIG. 3 shows a second embodiment of a memory cell array section and column selection MOS transistors 271, 272, —are respectively connected in series with bit lines 251, 252, —and the bit liens 251, 252 —are selectively connected to a line 28 which is connected to the drain of the MOS transistor 16 constituting the load element via the MOS transistors 271, 272, —. An inverter 21 constituted by a sense amplifier is connected to the line 28.

That is, one of the bit lines is selected by column selection signals CS respectively supplied to the gates of the MOS transistors 271, 272, —, and that one of the memory cells which is connected to the selected bit line is selected by the cell selection signal and the thus selected memory cell is monitored. In this case, a MOS transistor having the same dimensions as the column selection MOS transistors 271, 272, —is serially connected between the pad 19 and the MOS transistor 18 so that a current mirror circuit can be constituted by the MOS transistors 16 and 18. The MOS transistor 29 is supplied with a signal CS' which is synchronized with the column selection signal CS supplied to the gates of the MOS transistors 271, 272, —.

The bit lines 251, 252, —are divided into a plurality of groups a, b, —based on the order of the arrangement, for example, and the column selection MOS transistors in each of the groups a, b, —are selectively driven.

Figure 4:
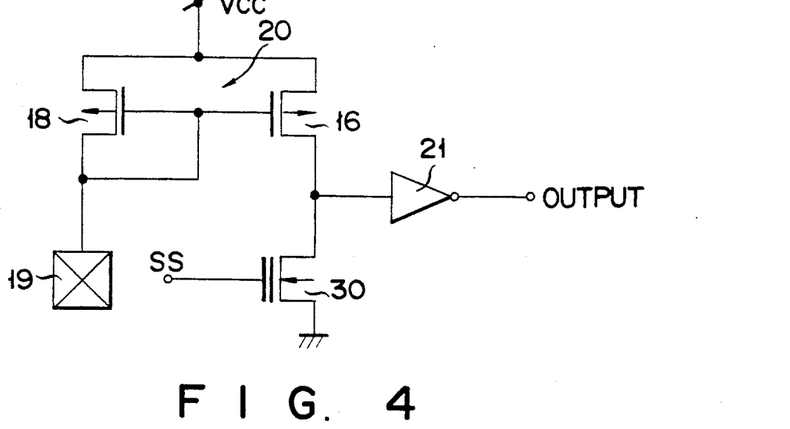
FIGS. 4, 5 and 6 are circuit diagrams respectively showing monitoring circuit sections according to third to fifth embodiments of this invention.
Figure 5:
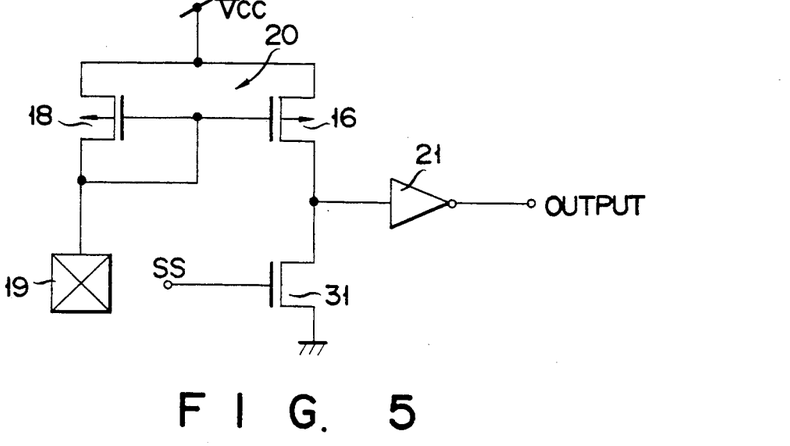
Figure 6:
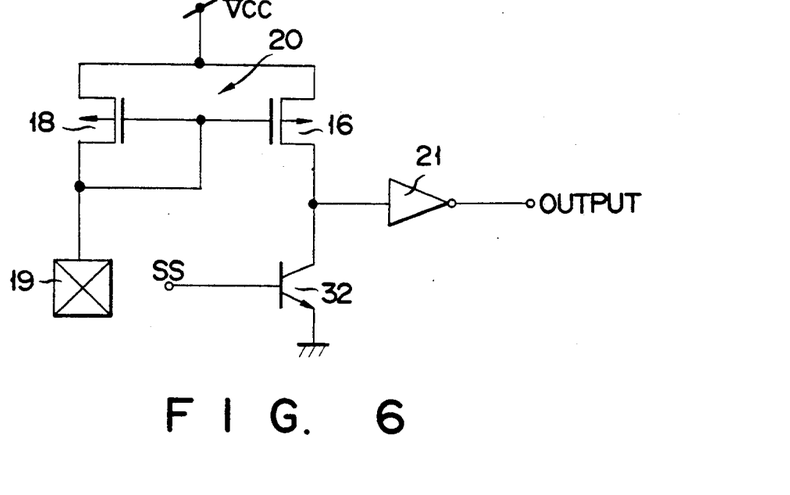

In the above embodiment, the EEPROM in which memory cells treated as monitoring cells are constituted by floating gate MOS transistors is shown. However, as shown in a third embodiment shown in FIG. 4, this invention can be applied to an EPROM in which a memory cell is constituted by a "FLOTOX" type MOS transistor 30. Further, as shown in fourth and fifth embodiments shown in FIGS. 5 and 6, this invention can be applied to a mask ROM in which a memory cell is constituted by a MOS transistor 31 or bipoar transistor 32. As shown in FIGS. 4 to 6, a selection signal is supplied to the transistor 30, 31 and 32. In these embodiments, portions which are the same as those of FIG. 1 are denoted by the same reference numerals and the explanation thereof is omitted.

Figure 7:
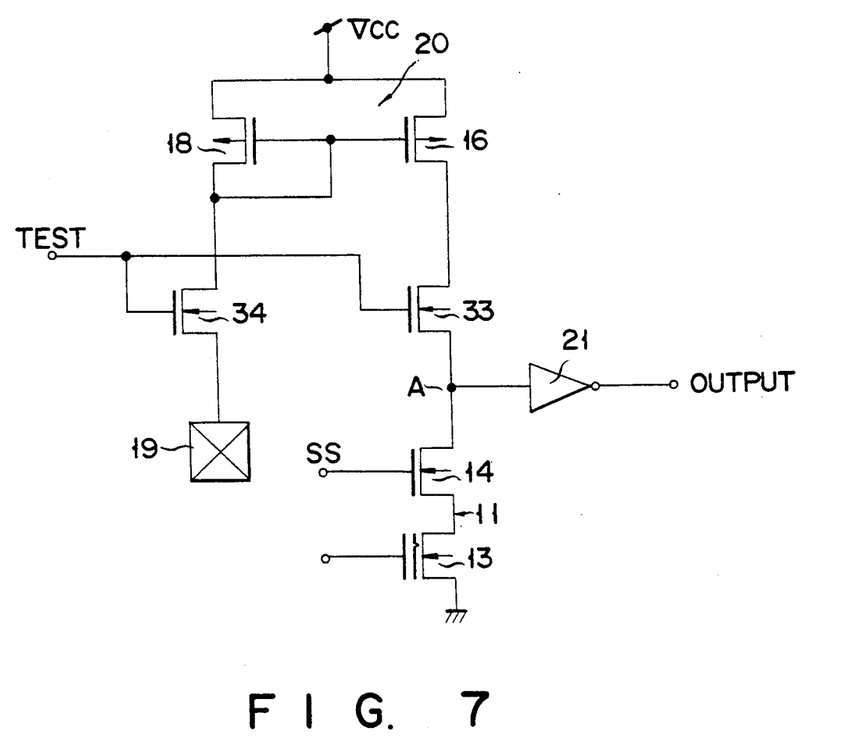
FIG. 7 is a circuit diagram showing a monitoring circuit section of a memory device according to a sixth embodiment of this invention.

FIG. 7 shows a sixth embodiment in which test mode selection N-channel MOS transistors 33 and 34 are connected in series with respective MOS transistors 16 and 18 which constitute a current mirror circuit 20. The other portions are constituted in the same manner as in the embodiment shown in FIG. 1.

The test mode select MOS transistors 33 and 34 are formed with the same dimensions and a test mode control signal TEST is supplied to the gates of the transistors 33 and 34. An inverter 21 is connected to a node A between the MOS transistor 33 and a memory cell select MOS transistor 14.

Figure 8:
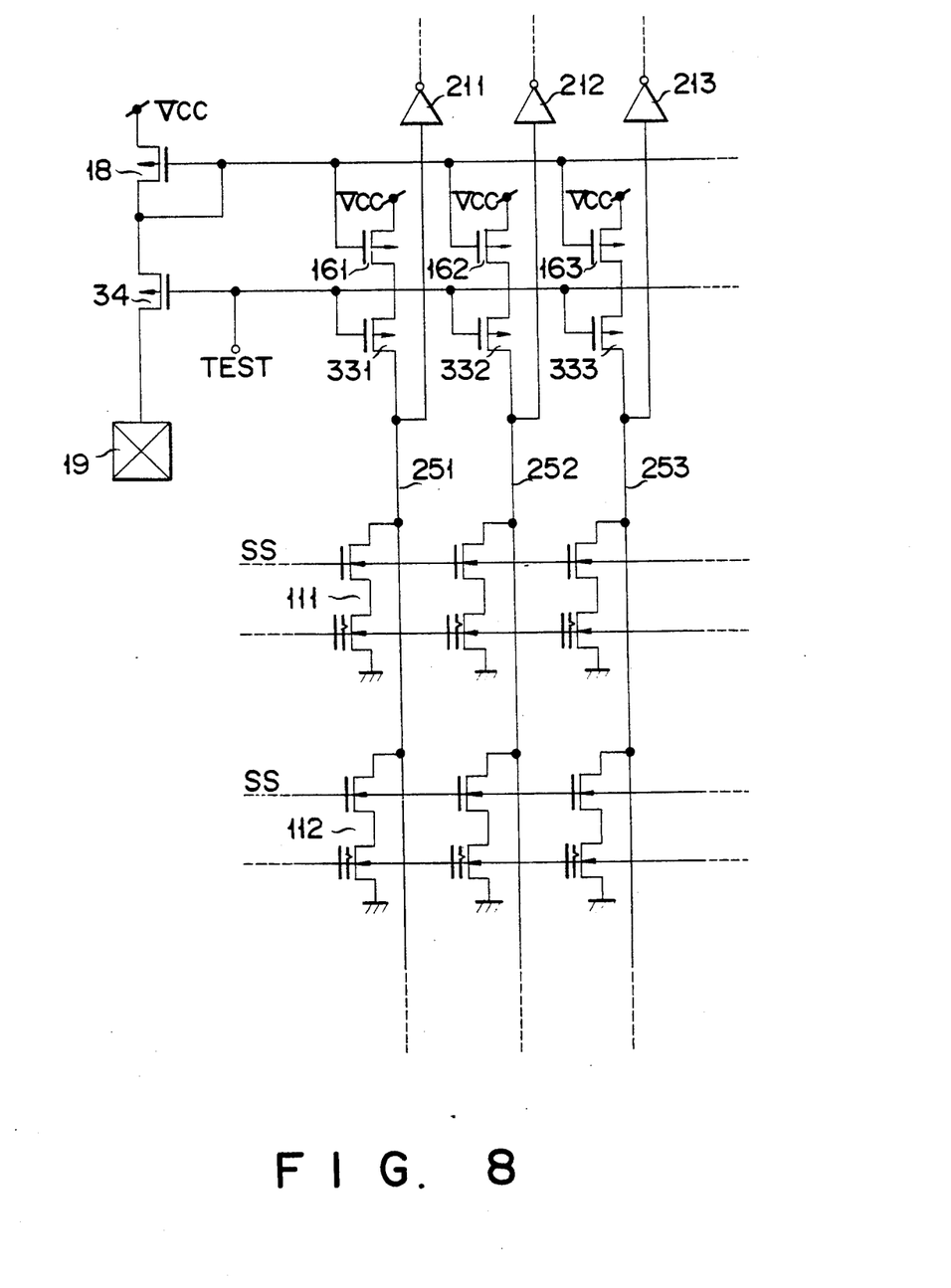
FIG. 8 is a circuit diagram showing a memory cell array having the monitoring circuit of FIG. 7 formed therein.

FIG. 8 shows a state of the memory cell array having the above-described monitoring function, and MOS transistors 331, 332, —are respectively connected to bit lines 251, 252, —and a test signal TEST is supplied to the gates of the MOS transistors 331, 332, —and to the gate of the MOS transistor 34.

With the semiconductor memory device of the above construction, when the test mode control signal TEST is set to the high level or active level, for example, then the MOS transistors 33 and 34 are turned on so as to permit the memory cell array to be monitored. Therefore, in a case where the pad 19 to which a monitor controlling voltage is supplied is constituted so as to effect another function, the test mode control signal TEST is set to the low level so as to turn off the MOS transistors 33 and 34 when the ordinary memory function is used. Then, supply of current to the MOS transistor 16 acting as a load element and to the MOS transistor 18 acting as a load control element is interrupted so as to reduce the power consumption in the monitoring circuit section.

Reduction in the power consumption of the monitoring circuit in the test mode can also be attained by turning on and off the power source system (Vcc) of the monitoring circuit in response to the test mode control signal, for example.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device having monitoring function, comprising:
   a memory cell array provided on a semiconductor chip and constituted by connecting a plurality of memory cells to a plurality of bit lines:
   a load element which is provided on said semiconductor chip and through which a power source is connected to at least one selected memory cell of said memory cell array;
   a load controlling element formed on said semiconductor chip to variably control the resistance of said load element and control a current supplied to the selected memory cell;
   a pad provided on said semiconductor chip to receive a monitor controlling voltage in the monitoring mode; and
   potential detecting means for detecting a potential on a connection node between said load element and said memory cell and outputting the detected potential as a high level or low level signal to the exterior.

2. A device according to claim 1, wherein said memory cell is constituted by a series circuit of a select MOS transistor and a data storing floating gate MOS transistor and constitutes a nonvolatile memory.

3. A device according to claim 1, wherein said memory cell is constituted by a "FLOTOX" type MOS transistor whose gate is connected to receive a select signal.

4. A device according to claim 1, wherein each of said memory cell is constituted by a bipolar transistor or MOS transistor and constitutes a mask ROM.

5. A device according to claim 1, wherein said load element is constituted by a MOS transistor whose source is connected to a power source and whose drain is connected to said memory cell.

6. A device according to claim 1, wherein said load element is controlled by a load controlling element which is controlled by a control voltage applied to said pad.

7. A device according to claim 6, wherein said load element is constituted by a MOS transistor and said load controlling element is constituted by a MOS transistor having the same dimensions as the MOS transistor constituting said load element and a pair of said MOS transistors constituting said load element and load controlling element provide a current mirror circuit.

8. A semiconductor memory device having monitoring
 a plurality of MOS transistors constituting a load element and having drains respectively connected to a plurality of bit lines to which a plurality of memory cells are connected and sources connected to a power source;
 a single MOS transistor for load control having a gate connected to the gates of said plurality of MOS transistors constituting said load element and a source connected to said power source;
 a pad connected to the drain and gate of said single MOS transistor for load control and to selectively receive a monitor controlling voltage; and
 a voltage detection circuit connected to said plurality of bit lines, said voltage detection circuit being also used as a sense amplifier connected to said bit lines of a memory cell array.

9. A device according to claim 8, further comprising a plurality of column select MOS transistors which are respectively connected in series with said plurality of bit lines and whose conduction states are selectively controlled by a column select signal generated for each of said bit lines, and a single MOS transistor which has the same dimensions as said column select MOS transistors and which is connected in series with said single MOS transistor for load control and is set in the ON state when at least one of said plurality of column select MOS transistors is set in the ON state.

10. A device according to claim 9, wherein said plurality of bit lines are connected together and connected to a voltage detection circuit which is also used as a sense amplifier.

11. A device according to claim 9, wherein said plurality of bit lines are divided into a plurality of groups and said column select MOS transistors of said respective groups are controlled in parallel so that one of those of said column select MOS transistors which belong to each of said groups can be selected for each of said groups.

12. A device according to claim 8, further comprising a plurality of MOS transistors for test instruction connected in series with said plurality of bit lines and a test setting MOS transistor having the same dimensions as said test instruction MOS transistors and connected between said single MOS transistor for load control and said pad, said test instruction and test setting MOS transistors being commonly controlled by a test signal.

* * * * *

UNITED STATES PATENT AND TRADEMARK OFFICE
CERTIFICATE OF CORRECTION

PATENT NO. : 5,179,537
DATED : January 12, 1993
INVENTOR(S) : Osamu Matsumoto It is certified that error appears in the above-identified patent and that said Letters Patent is hereby corrected as shown below:

Claim 8, column 7, line 13, after "monitoring" insert --function, comprising:--.

Signed and Sealed this

Eleventh Day of January, 1994

Attest:

BRUCE LEHMAN

Attesting Officer

Commissioner of Patents and Trademarks